(12) United States Patent
Konstantatos et al.

(10) Patent No.: US 11,527,662 B2
(45) Date of Patent: Dec. 13, 2022

(54) OPTOELECTRONIC APPARATUS WITH A PHOTOCONDUCTIVE GAIN

(71) Applicant: Fundació Institut de Ciències Fotôniques, Barcelona (ES)

(72) Inventors: Gerasimos Konstantatos, Barcelona (ES); Frank Koppens, Barcelona (ES); Dominik Kufer, Barcelona (ES); Ivan Nikitskiy, Barcelona (ES)

(73) Assignee: FUNDACIÓ INSTITUT DE CIÈNCIES FOTÔNIQUES, Castelldefels (ES)

( * ) Notice: Subject to any disclaimer, the term of this patent is extended or adjusted under 35 U.S.C. 154(b) by 0 days.

(21) Appl. No.: 14/800,320

(22) Filed: Jul. 15, 2015

(65) Prior Publication Data

US 2016/0020352 A1 Jan. 21, 2016

(30) Foreign Application Priority Data

Jul. 15, 2014 (EP) ..................................... 14177172

(51) Int. Cl.
*H01L 31/0352* (2006.01)
*H01L 31/101* (2006.01)
*H01L 31/18* (2006.01)

(52) U.S. Cl.
CPC .... *H01L 31/035218* (2013.01); *H01L 31/101* (2013.01); *H01L 31/18* (2013.01)

(58) Field of Classification Search
CPC ......................... H01L 31/035218; H01L 31/10
See application file for complete search history.

(56) References Cited

U.S. PATENT DOCUMENTS

| 5,266,814 A * | 11/1993 | Inata | B82Y 20/00 257/29 |
| 7,307,277 B2 * | 12/2007 | Frey | H01L 51/0516 257/40 |
| 8,598,567 B2 * | 12/2013 | Huang | H01L 31/035218 257/257 |
| 9,030,189 B2 * | 5/2015 | Sargent | H01L 31/035218 324/760.02 |
| 9,130,085 B2 * | 9/2015 | Colli | H01L 31/1013 |
| 9,233,845 B2 * | 1/2016 | Gerasimos | H01L 29/0665 |

(Continued)

FOREIGN PATENT DOCUMENTS

WO  WO 2013/017605 A1  2/2013
WO  WO 2013/063399 A1  5/2013

OTHER PUBLICATIONS

Kamat, Prashant V., "Quantum Dot Solar Cells. Semiconductor Nanocrystals as Light Harvesters," Journal of Physical Chemistry C, vol. 0, No. 0, Oct. 18, 2008, pp. 0-0, XP55001941

(Continued)

*Primary Examiner* — M. A. Golub-Miller
(74) *Attorney, Agent, or Firm* — Jenkins, Wilson, Taylor & Hunt, P.A.

(57) ABSTRACT

An optoelectronic apparatus, such as a photodetector apparatus comprising a substrate (1), a dielectric layer (2), a transport layer, and a photosensitizing layer (5). The transport layer comprises at least a 2-dimensional semiconductor layer (3), such as $MoS_2$, and the photosensitizing layer (5) comprises colloidal quantum dots. Enhanced responsivity and extended spectral coverage are achieved with the disclosed structures.

8 Claims, 6 Drawing Sheets

(56) References Cited

U.S. PATENT DOCUMENTS

| | | | | |
|---|---|---|---|---|
| 9,331,293 B2* | 5/2016 | Huang | ................ | H01L 51/428 |
| 9,627,562 B2* | 4/2017 | Zhang | ................ | H01L 29/127 |
| 10,541,348 B2* | 1/2020 | White | ................ | H01L 31/113 |
| 2009/0014757 A1* | 1/2009 | Takulapalli | ........ | G01N 27/4145 |
| | | | | 257/253 |
| 2011/0036971 A1* | 2/2011 | Ho | ................ | H01L 51/426 |
| | | | | 250/214.1 |
| 2011/0278541 A1 | 11/2011 | Huang et al. | | |
| 2011/0291158 A1* | 12/2011 | Ogura | ............ | H01L 31/03046 |
| | | | | 257/187 |
| 2013/0032782 A1 | 2/2013 | Gerasimos et al. | | |
| 2013/0049738 A1* | 2/2013 | Sargent | ............ | G01R 31/2601 |
| | | | | 324/96 |
| 2013/0105824 A1* | 5/2013 | Paranjape | ............ | H01L 31/032 |
| | | | | 257/86 |
| 2013/0193404 A1* | 8/2013 | Koppens | ............ | H01L 31/0475 |
| | | | | 977/734 |
| 2014/0312302 A1* | 10/2014 | Oron | ................ | C09K 11/54 |
| | | | | 257/14 |
| 2016/0211392 A1* | 7/2016 | So | ................ | H01L 31/101 |
| 2016/0233447 A1* | 8/2016 | Kim | ................ | H01L 51/5056 |
| 2016/0351738 A1* | 12/2016 | Choi | ................ | H01L 31/09 |

OTHER PUBLICATIONS

Kamat, P. V., "Quantum Dot Solar Cells. The Next Big Thing in Photovoltaics," Journal of Physical Chemistry Letters, American Chemical Society, US, vol. 4, No. 6, Mar. 21, 2013, pp. 908-918, XP008163740.

Konstantatos, G., et al., "Solution-Processed Quantum Dot Photodetectors," Proceedings of the IEEE, IEEE, New York, US, vol. 97, No. 10, Oct. 1, 2009, pp. 1666-1683, XP011276720.

Kuo, Chih-Yin, et al., "An Organic Hole Transport Layer Enhances the Performance of Colloidal PbSe Quantum Dot Photovoltaic Devices," Advanced Functional Materials, Wiley-V C H Verlag GMBH & Co. KGAA, DE, vol. 20, No. 20, Oct. 22, 2010, pp. 3555-3560, XP001558152.

Osedach, Tim, et al., "Lateral Heterojunction Photodetector Consisting of Molecular Organic and Colloidal Quantum Dot Thin Films," Applied Physics Letters, American Institute of Physics, US, vol. 94, No. 4, Jan. 27, 2009, pp. 43307-43307, XP012118808.

Communication of the extended European search report corresponding to European application No. 14177172.5 dated Jan. 13, 2015.

Neto et al. (2009) The electronic properties of graphene. Reviews of Modern Physics 81:1-55.

Huo et al. (2017) "MoS2—HgTe Quantum Dot Hybrid Photodetectors beyond 2 μm", Adv. Mater., 29, 1606576 (pp. 1-5).

Özdemir et al. (2019) "High Sensitivity Hybrid PbS CQD—TMDC Photodetectors up to 2 μm," pp. 1-13 and S1-S11.

Brown et al. (2014) Energy Level Modification in Lead Sulfide Quantum Dot Thin Films through Ligand Exchange. American Chemical Society. 8(6):5863-5872.

Kang et al. (2013) Band offsets and heterostructures of two-dimensional semiconductors. Applied Physics Letters. 102, 01211-1-4.

* cited by examiner

OPTOELECTRONIC APPARATUS WITH A PHOTOCONDUCTIVE GAIN

CROSS-REFERENCE TO RELATED APPLICATIONS

Priority is hereby claimed under 35 USC § 119 to co-pending European patent application Serial No. 14177172.5, filed 15 Jul. 2014, which is incorporated herein by reference.

FIELD OF THE INVENTION

The present invention has its application within the opto-electronics sector and, especially, in the industrial area engaged in providing optoelectronic platforms with enhanced photoconductive gain.

BACKGROUND OF THE INVENTION

Related Art

Many optoelectronic applications, such as photodetectors and photovoltaic cells, rely on the generation of an electric current under incidence of incoming light upon the device. Light absorption at an active layer triggers the separation of electron-hole pairs, with free electrons circulating through a transport layer driven by an electric field applied by electrodes. In order to provide an efficient conversion under diverse conditions and wavelength regimes, many optoelectronic platforms have been proposed over the years.

For example, WO 2013017605 A1 discloses an optoelectronic platform in which the transport layer consists of a semi-metallic carbon based conductor, such as graphene. A quantum dot sensitizing layer is also comprised in order to induce a change in the conductivity of the transport layer. In view of the high mobility of graphene and long lifetime of carriers in the quantum dots, a large photoconductive gain was achieved. However, this apparatus requires a high dark current level in order to achieve the desired responsivity. This dark current level requirement further affects the sensitivity and the shot-noise limit of the apparatus.

On the other hand, 2-dimensional semiconductors have also been used to implement transport layers in photoresponsive optoelectronic devices. For example, WO 2013063399 A1 presents an optoelectronic platform incorporating $MoS_2$ layers. However, this technology presents a limited spectral coverage, determined by the bandgap of the $MoS_2$.

Therefore, there is still the need in the state of the art of an optoelectronic platform, capable of providing a high responsivity for low dark current levels for a broad spectral range of incoming light.

SUMMARY OF THE INVENTION

The current invention solves the aforementioned problems by disclosing an optoelectronic apparatus, and a method for its fabrication, which provide enhanced responsivity at low dark current levels and extended spectral coverage, due to the combination of a 2-dimensional semiconductor transport layer and a photosensitizing layer comprising colloidal quantum dots.

In a first aspect of the invention, an optoelectronic apparatus with enhanced responsivity and spectral coverage is disclosed. The optoelectronic apparatus comprises, from top to bottom, a photosensitizing layer, a transport layer, a dielectric layer and a substrate. Preferably, the optoelectronic apparatus is adapted to act as a photodetector by comprising a first electrode and a second electrode connected to the transport layer through two contacts of a conductor layer. Upon reception of incident light at the photosensitizing layer, an electric current between the first electrode and the second electrode is hence created through the transport layer. More preferably, the substrate is connected to a third electrode, therefore enabling to tune the conductivity of the transport by applying a bias voltage to said third electrode.

The photosensitizing layer comprises colloidal quantum dots for light absorption and transport layer conductivity modulation. Preferably, the photosensitizing layer comprise one or more of the following types of quantum dots: PbS, CIS (Copper indium disulfide), Ge, Si, HgTe, CIGS (Copper indium gallium selenide), CZTS (Copper zinc tin sulfide), $AgBiS_2$, $SnO_2$, ITO (indium tin oxide) and ZnO.

The transport layer comprises at least a 2-dimensional semiconductor layer, being the number of 2-dimensional semiconductor layers preferably comprised between two and ten. Preferably, the 2-dimensional semiconductor layer (or layers) comprises one or more of the following materials: $MoS_2$, $MoSe_2$, $WS_2$, $WSe_2$, black phosphorous and $SnS_2$.

The substrate layer preferably comprises a doped semiconductor selected between Si, ITO, AZO (Aluminum doped zinc oxide) and graphene. The dielectric layer preferably comprises at least one of the following materials: $SiO_2$, $AlO_2$, $HfO_2$, parylene and boron nitride.

In some preferred embodiments, the optoelectronic apparatus further comprises an interlayer barrier located between the transport layer and the photosensitizing layer. Preferably, the interlayer barrier comprises either one of the following materials: ZnO, $TiO_2$, $SiO_2$, $AlO_2$, $HfO_2$ and boron nitride; or a self assembled monolayer of organic molecules such as ethanedithiol, propanedithiol, butanedithiol, octanedithiol and dodecanedithiol. The thickness of the interlayer barrier is preferably comprised between 0.1 and 10 nm.

In a second aspect of the present invention, a fabrication method of a photosensitive optoelectronic apparatus is disclosed. The method comprises depositing a dielectric layer, a transport layer and a photosensitizing layer on a substrate. The transport layer is deposited by depositing one or more 2-dimensional semiconductor layers. The photosensitizing layer comprises colloidal quantum dots. Preferably, the 2-dimensional semiconductor layers are either grown by chemical vapor deposition or exfoliated from a bulk crystal.

Note that all the preferred options of the apparatus of the invention (such as materials, structures, thicknesses, electrodes, etc.), can also be implemented as preferred options of the method of the invention by appropriately adapting any deposition and/or etching step thereof.

The disclosed apparatus and method provide an optoelectronic platform, which combines an enhanced responsivity under low dark current and an extended spectral range for photodetection. These and other advantages of the invention will become apparent from the following description and accompanying drawings.

BRIEF DESCRIPTION OF THE DRAWINGS

For the purpose of aiding the understanding of the characteristics of the invention, according to a preferred practical embodiment thereof and in order to complement this description, the following figures are attached as an integral part thereof, having an illustrative and non-limiting character.

DETAILED DESCRIPTION OF THE INVENTION

The matters defined in this detailed description are provided to assist in a comprehensive understanding of the invention. Accordingly, those of ordinary skill in the art will recognize that variation changes and modifications of the embodiments described herein can be made without departing from the scope and spirit of the invention. In particular, the preferred embodiments of the invention are described for an optoelectronic apparatus based on a $MoS_2$ transport layer sensitized with PbS quantum dots. Nevertheless, the description of the photonic structures and of their underlying mechanism can be generally applied to other materials.

Note that in this text, the term "comprises" and its derivations (such as "comprising", etc.) should not be understood in an excluding sense, that is, these terms should not be interpreted as excluding the possibility that what is described and defined may include further elements, steps, etc.

Figure 1:
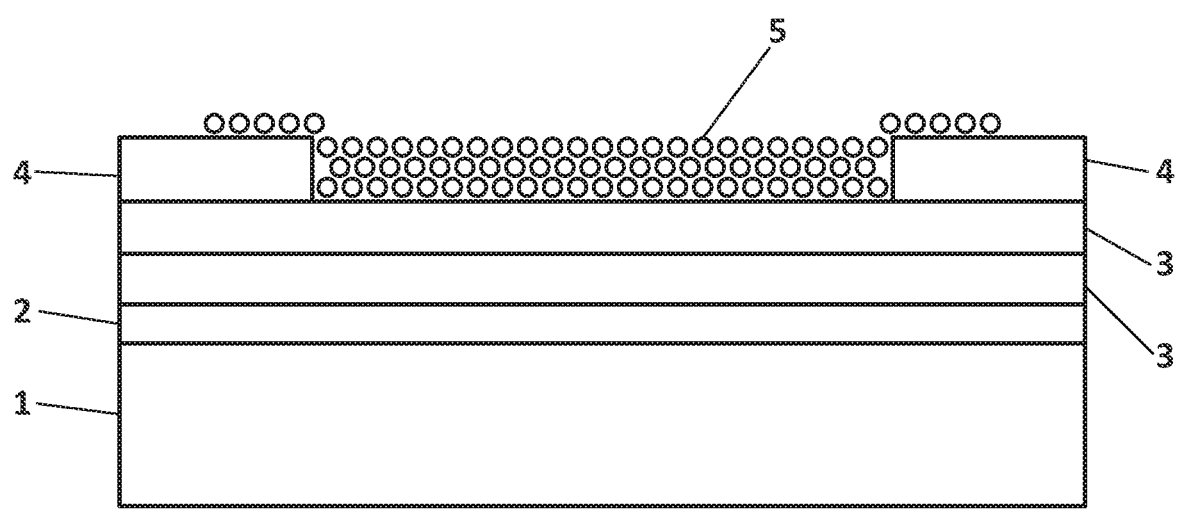
FIG. 1 shows a cross-sectional view of a preferred embodiment of the invention.

FIG. 1 shows a cross-sectional view of a preferred embodiment of the optoelectronic apparatus of the invention, fabricated according to a preferred embodiment of the method of the invention. The apparatus comprises a substrate 1 fabricated of a heavily doped semiconductor such as Silicon, on top of which is deposited a dielectric layer 2 of silicon oxide. The transport layer of the apparatus is implemented by two 2-dimensional semiconductor (2DS) layers 3.

Each 2DS layer 3 is a monolayer of $MoS_2$ defined by three atomic layers (S—Mo—S), as opposed to single-atomic layer graphene. Moreover $MoS_2$ possess a bandgap and therefore allows the operation of the device in the off state of the transport layer, determined by the application of a back gate voltage. This operation regime is not possible with graphene, due to the lack of the bandgap.

The 2DS layers 3 are sensitized by a PbS quantum dot (QD) sensitizing layer 5. Thus, the optical absorption of the apparatus and therefore its spectral sensitivity is determined by that of the QDs. The apparatus can hence detect photons that have lower energy than the bandgap of the transport layer, extending the spectral range for photodetection.

A conductor layer 4 partially covers the top 2DS layer 3, providing contact points for electrodes. The conductor layer 4 can be implemented, for example, with Ti, Au, or any other conductor with similar functionalities. The conduction layer 4 can be fabricated, for example, by selective deposition or by a complete deposition followed by a selective etching.

Quantum dots are deposited in a two-step process involving treatment with 1,2-ethanedithiol (EDT) followed by PbS QD deposition. Initially the $MoS_2$ layer becomes more n-type doped due to surface doping from EDT. The subsequent deposition of p-type PbS QDs turns the $MoS_2$ film again less n-type doped due to the formation of the heterojunction between the n-type $MoS_2$ transport layer and the p-type PbS QD sensitizing layer 5. The $MoS_2$ layer in its final configuration is still more n-type doped than the initial stand-alone flake, an effect that reduces the on/off-ratio in the experimental range of $V_G$.

Thicknesses of the layers of the apparatus preferably are selected from the following ranges:

Substrate layer 1: 0.1 nm-10 mm
Dielectric layer 2: 5 nm-400 nm.
Transport layer: between 1 and 100 $MoS_2$ monolayers.
QD layer 5: 2 nm-2,000 nm
Conductor layer 4: 0.1 nm-100,000 nm Additional substrate layers 1 can be included to provide support to the whole apparatus, such as silicon substrates, glass substrates or flexible plastic substrates like polyethylene terephtalate (PET).

Figure 2:
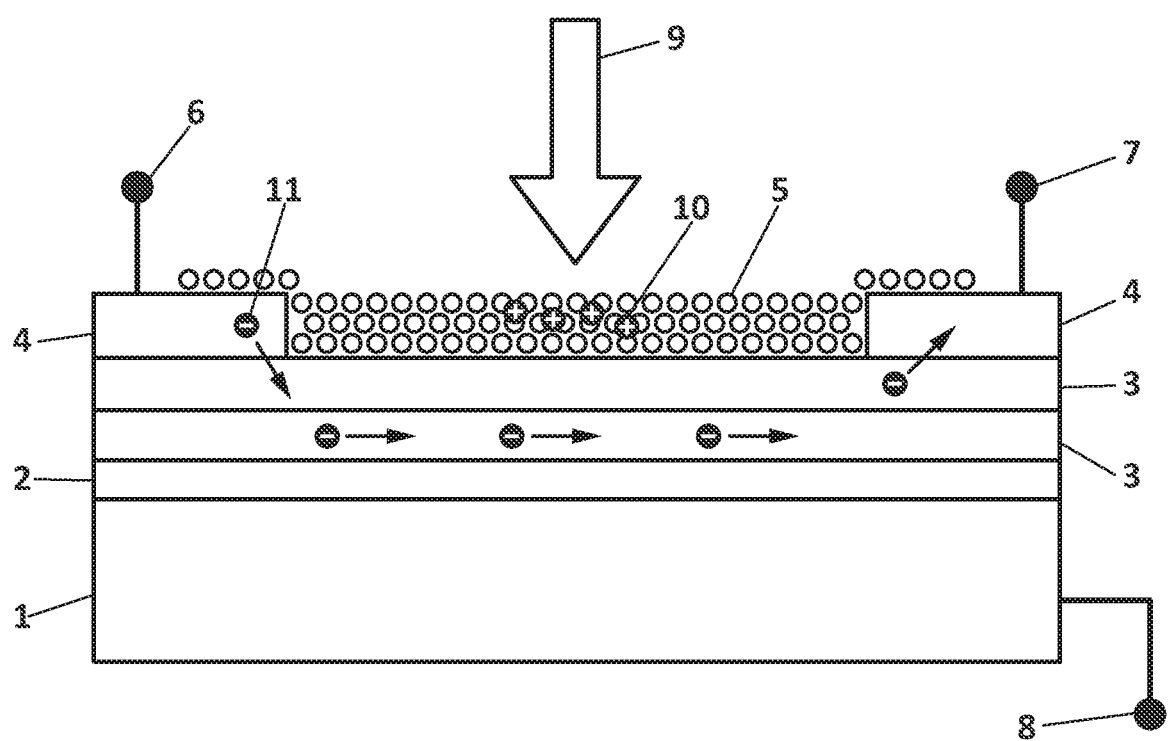
FIG. 2 is a scheme exemplifying the operation of said preferred embodiment as a photodetector.

FIG. 2 presents an optoelectronic apparatus with the aforementioned structure and materials operating as a transistor. A first electrode 6 (drain electrode) and a second electrode 7 (source electrode) are connected to the top 2DS layer 3 through the conductor layer 4. A third electrode 8 (back-gate electrode) is connected to the substrate layer 1. Incident light 9 is absorbed by the QD layer 5, resulting in the separation of photoexcited electron 11-hole 10 pairs at the p-n-interface between $MoS_2$ and PbS. While holes 10 remain within the QD layer 5, electrons 11 circulate through the $MoS_2$ channel driven by an electric field $V_{DS}$ applied between the drain electrode 6 and the source electrode 7. The current flow can be controlled electrically by applying an appropriate back-gate voltage ($V_G$) at the back-gate electrode 8. At strongly negative values of $V_G$, the gating depletes the n-type $MoS_2$ sheet, increasing the resistance of the device (operation in OFF mode). By increasing $V_G$, the $MoS_2$ channel falls in the accumulation region and the transistor is in the ON state.

Figure 3:
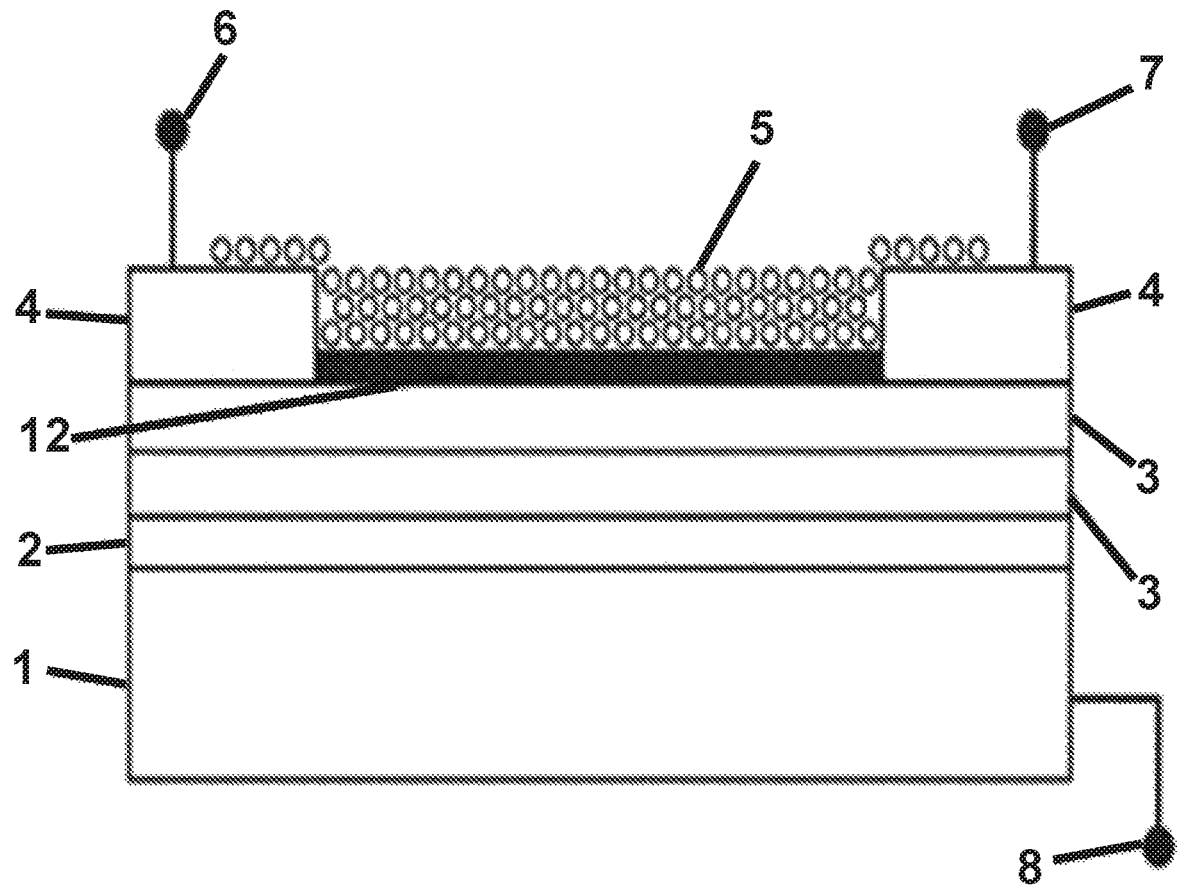
FIG. 3 presents another embodiment of the invention, comprising an interlayer barrier between the transport layer and the quantum dot layer.

FIG. 3 shows a variation of the optoelectronic apparatus and method in which a thin interlayer barrier 12 is deposited between the top 2DS layer 3 and the QD layer 5. The interlayer barrier comprises ZnO, $TiO_2$, Alumina, Hafnia, boron nitride or a self assembled monolayer of organic molecules including Ethane-, propane-, butane-, octane- or dodecane-dithiol molecules. The thickness of the interlayer barrier may vary from 0.1 nm up to 10 nm. The effect of the interlayer barrier is to tailor the electronic interface between the QD and 2DS layer to improve the performance of the device in achieving more efficient charge transfer, tailoring the temporal response and improve the stability of the device.

In all the optoelectronic apparatus, materials of the QD layer 5 and the transport layer are selected in order to ensure a high carrier mobility in the transport layer and hence a carrier transit time ($t_{transit}$) that is orders of magnitude shorter than the trapping lifetime ($t_{lifetime}$) in the quantum dots. Since the gain of the device is given by the ratio $t_{lifetime}/t_{transit}$, this selection of materials provides a highly responsive device. The temporal response of the hybrid photodetector is determined by $t_{lifetime}$, showing a time constant of ~0.3 s for the particular case of a $MoS_2$/PbS device.

Figure 4:
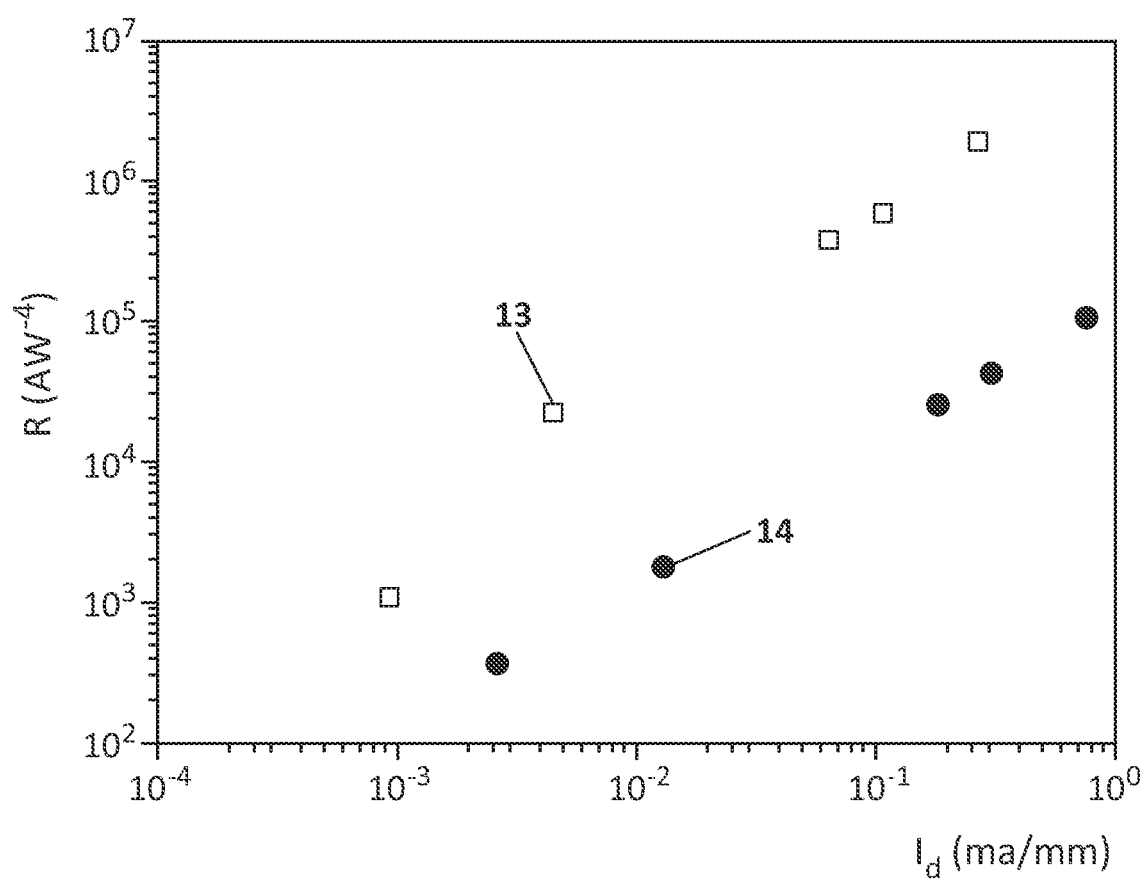
FIG. 4 compares the responsivity of an embodiment of the invention based on $MoS_2$ and a graphene/QD photodetector known in the state of the art.

The existence of a bandgap in the channel of the transistor, which allows the facile tuning of the dark conductivity, is a powerful tool to increase the sensitivity of a detector implemented in the proposed optoelectronic platform, as the noise current in the shot noise limit scales as $i_n=(2qI_dB)^{1/2}$, where q is the electron charge, $I_d$ the dark current flowing in the device and B is the electrical bandwidth. The resultant sensitivity of the detector in the shot-noise limit is then expressed by the normalized detectivity as $D^*=R(AB)^{1/2}/i_n$, where R is the responsivity, A the area of the device and B is the electrical bandwidth. At high negative back-gate bias the channel is depleted from free carriers in the dark state and therefore the detector exhibits high sensitivity with $D^*$ reaching up to $7 \times 10^{14}$ Jones at $V_G$ of −100 V in the shot-noise limit. $MoS_2$/PbS photodetectors show significant performance even at very low applied electric field of 3.3 mV/μm with corresponding responsivity of $10^3$ A/W. The presence of the bandgap in the $MoS_2$ channel and thus the offered opportunity to tune the dark current via the back gate allows the achievement of similar responsivity values achieved via previously reported structures relying on graphene, albeit with lower dark current values. This reduction in the dark current is apparent in FIG. 4, which presents experimental results of the responsivity vs dark current for a $MoS_2$/PbS 13 and a graphene/QD 14 photodetectors. The $MoS_2$/PbS 13 photodetector can achieve the same responsivity with more than an order of magnitude reduction in the dark current.

Figure 5:
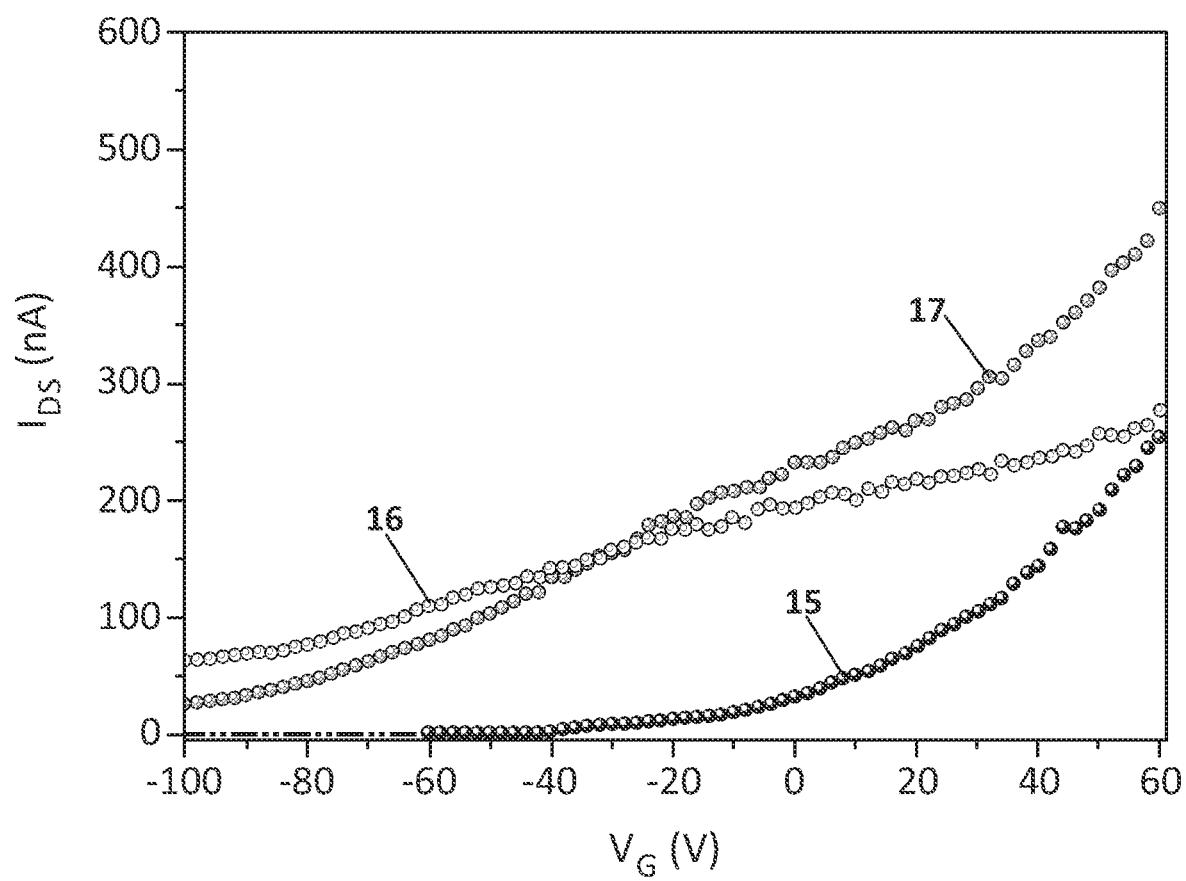
FIG. 5 compares the responsivity of a $MoS_2$ photodetector with and without a quantum dots layer, according to a preferred embodiment of the invention.

FIG. 5 displays the field effect transistor (FET) characteristics of a bilayer $MoS_2$ transistor 15 and its $MoS_2$/PbS hybrid device fabricated on a Si/SiO$_2$ substrate. All measurements were performed in two-probe configuration and carried out under ambient conditions. The source-drain current ($I_{DS}$) modulation characteristic as a function of $V_G$ and under bias voltage $V_{DS}$=50 mV is presented in linear scale. The bilayer $MoS_2$ transistor 15 shows a field effect mobility of 10-20 $cm^2V^{-1}s^{-1}$ in the linear regime and on/off-ratios in the range of $10^5$-$10^6$. A significant increase in the drain current of $MoS_2$/PbS transistors is observed for the $MoS_2$/PbS hybrid device, both for light 16 and dark 17 states.

Figure 6:
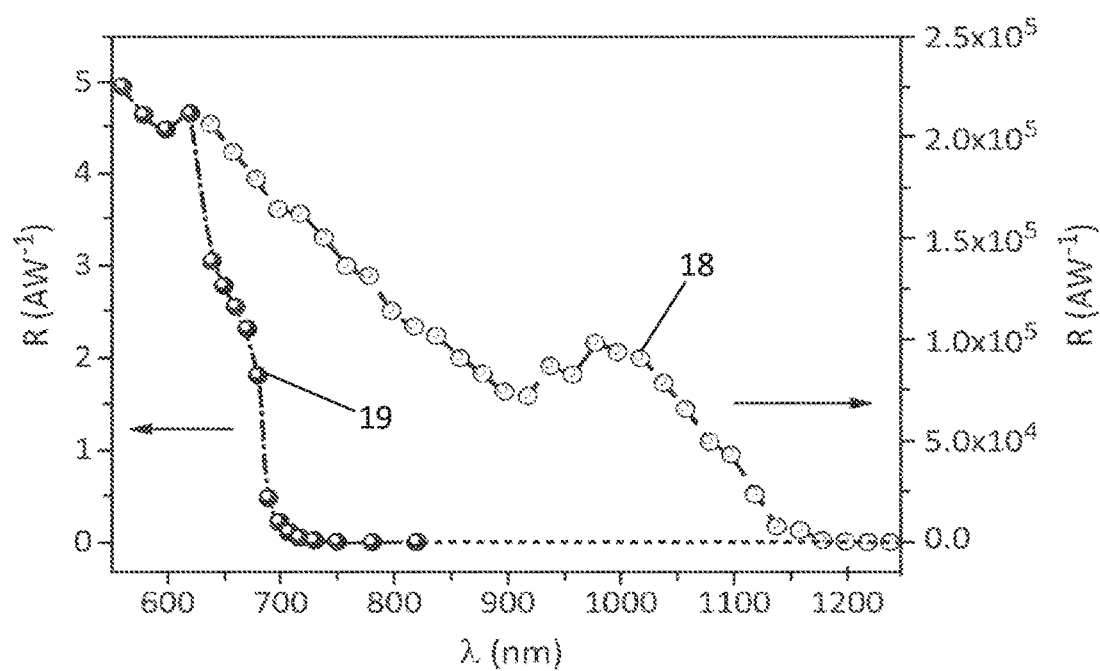
FIG. 6 shows the spectral responsivity of a $MoS_2$-only phototransistor determined by the bandgap of a 2-layer flake of around 1.8 eV.

FIG. 6 shows the spectral responsivity of a $MoS_2$-only 19 phototransistor that exhibits a responsivity up to 5 NW, being its spectral sensitivity determined by the bandgap of a 2-layer flake of around 1.8 eV. The equivalent hybrid $MoS_2$-Pbs 18 detector shows dramatically higher responsivity on the order of $10^5$-$10^6$ NW and its spectral sensitivity is now extended to near infrared, as dictated by the bandgap of the PbS QDs. While the $MoS_2$ device absorbs only until a wavelength of ~700 nm, the hybrid follows clearly the expected PbS absorption with a exciton peak at 980 nm, which can be tuned by controlling the quantum dot species and size. This allows the development of detectors that have sensitivity further into the short-wave infrared using larger PbS QDs and/or alternative QD species.

Experimental results therefore prove an increased responsivity under similar dark currents than graphene-based photodetectors, as well as a more extended spectral range than traditional $MoS_2$ devices.

The invention claimed is:

1. An optoelectronic apparatus comprising:
 a substrate, a dielectric layer, a transport layer, and a photosensitizing layer, wherein:
 the transport layer comprises at least one 2-dimensional semiconductor layer, wherein the material of the 2-dimensional semiconductor layer is MoS2;
 the photosensitizing layer comprises colloidal quantum dots for absorbing light that, in response to incident light, generates pairs of electric carriers, traps a single type of electric carriers of said pairs therein, and transfers a distinct single type of electric carriers of said pairs to the transport layer, to be transported thereby, wherein the material of said colloidal quantum dots is PbS; and
 wherein the optoelectronic apparatus further comprises:
 a first electrode and a second electrode connected to the transport layer,
 the transport layer being adapted to generate, and make flow through a transport channel, an electric current between the first electrode and the second electrode upon incidence of incoming light in the photosensitizing layer;
 a third electrode connected to the substrate; and
 a voltage source connected to the third electrode and providing a high negative bias voltage of up to −100V thereto to tune a conductivity of the transport layer by applying the high negative bias voltage to the third electrode, to the point that the transport channel is depleted of free carriers in order to minimize its conductivity in dark; and further
 wherein a type-II heterojunction is formed between the photosensitizing layer and the transport layer to thereby provide a photoconductive gain.

2. The optoelectronic apparatus according to claim 1, wherein the substrate layer comprises a doped semiconductor selected from the group consisting of Si, ITO, aluminum doped zinc oxide (AZO), and graphene.

3. The optoelectronic apparatus according to claim 1, wherein the material of the dielectric layer is selected from the group consisting of SiO2, HfO2, Al2O3, parylene, and boron nitride.

4. The optoelectronic apparatus according to claim 1, wherein the transport layer consists of a number of 2-dimensional semiconductor layers ranging from one to one hundred.

5. The optoelectronic apparatus according to claim 1, further comprising an interlayer barrier between the transport layer and the photosensitizing layer.

6. The optoelectronic apparatus according to claim 5, wherein the interlayer barrier is selected from the group consisting of ZnO, TiO2, Alumina, Hafnia, and boron nitride.

7. The optoelectronic apparatus according to claim 5, wherein the interlayer barrier comprises a self-assembled monolayer of organic molecules, selected from the group consisting of ethanedithiol, propanedithiol, butanedithiol, octanedithiol, and dodecanedithiol.

8. The optoelectronic apparatus according to claim 5, wherein the interlayer barrier has a thickness between 0.1 and 10 nm.

* * * * *